United States Patent
Yang et al.

(10) Patent No.: US 12,490,657 B2
(45) Date of Patent: Dec. 2, 2025

(54) PIEZOELECTRIC BIO-ORGANIC FILMS AND FABRICATION METHOD THEREOF

(71) Applicant: City University of Hong Kong, Hong Kong (CN)

(72) Inventors: Zhengbao Yang, Hong Kong (CN); Zhuomin Zhang, Hong Kong (CN); Xuemu Li, Hong Kong (CN)

(73) Assignee: City University of Hong Kong, Hong Kong (CN)

( * ) Notice: Subject to any disclaimer, the term of this patent is extended or adjusted under 35 U.S.C. 154(b) by 830 days.

(21) Appl. No.: 17/661,925

(22) Filed: May 4, 2022

(65) Prior Publication Data

US 2023/0363283 A1     Nov. 9, 2023

(51) Int. Cl.
| | |
|---|---|
| *H10N 30/857* | (2023.01) |
| *B29C 41/00* | (2006.01) |
| *C08J 5/18* | (2006.01) |
| *C08K 5/17* | (2006.01) |
| *H10N 30/077* | (2023.01) |
| *H10N 30/098* | (2023.01) |

(52) U.S. Cl.
CPC ......... *H10N 30/857* (2023.02); *B29C 41/006* (2013.01); *C08J 5/18* (2013.01); *C08K 5/175* (2013.01); *H10N 30/077* (2023.02); *H10N 30/098* (2023.02); *B29K 2995/0003* (2013.01); *C08K 2201/001* (2013.01)

(58) Field of Classification Search
CPC .. H10N 30/857; H10N 30/098; H10N 30/077; C08J 5/18; C08K 5/175; B29C 41/006; B29K 2995/0056; B29K 2995/0003
See application file for complete search history.

(56) References Cited

FOREIGN PATENT DOCUMENTS

WO      WO-2018193050 A1  *  10/2018  ........... C07C 229/08

OTHER PUBLICATIONS

Yang, Z., Zhou, S., Zu, J. & Inman, D. High-Performance Piezoelectric Energy Harvesters and Their Applications. Joule 2, 642-697 (2018).
Hong, Y. et al. Hierarchically Interconnected Piezoceramic Textile with a Balanced Performance in Piezoelectricity, Flexibility, Toughness, and Air Permeability. Adv. Funct. Mater. 2104737 (2021) doi: 10.1002/ADFM.202104737.
Liu, S. et al. A flexible and lead-free BCZT thin film nanogenerator for biocompatible energy harvesting. Mater. Chem. Front. 5, 4682-4689 (2021).
Zhang, Q. M., Bharti, V. & Zhao, X. Giant electrostriction and relaxor ferroelectric behavior in electron-irradiated poly (vinylidene fluoride-trifluoroethylene) copolymer. Science (80-.). 280, 2101-2104 (1998).
Guerin, S. et al. Control of piezoelectricity in amino acids by supramolecular packing. Nat. Mater. 17, 180-186 (2018).
Yang, F. et al. Wafer-scale heterostructured piezoelectric bio-organic thin films. Science (80-.). 373, 337-342 (2021).
Kim, D. et al. Biomolecular Piezoelectric Materials: From Amino Acids to Living Tissues. Adv. Mater. 32, 1-16 (2020).
Nguyen, V., Zhu, R., Jenkins, K. & Yang, R. Self-assembly of diphenylalanine peptide with controlled polarization for power generation. Nat. Commun. 7, 1-6 (2016).
Bera, S. et al. Molecular engineering of piezoelectricity in collagen-mimicking peptide assemblies. Nat. Commun. 12, (2021).
Lee, B. Y. et al. Virus-based piezoelectric energy generation. Nat. Nanotechnol. 7, 351-356 (2012).
Wang, J. et al. Piezoelectric Nanocellulose Thin Film with Large-Scale Vertical Crystal Alignment. ACS Appl. Mater. Interfaces 12, 26399-26404 (2020).
Shamos, M. H., Lavine, L. S. & Shamos, M. I. Piezoelectric effect in bone. Nature 197, 81-81 (1963).
Athenstaedt, H., Claussen, H. & Schaper, D. Epidermis of human skin: Pyroelectric and piezoelectric sensor layer. Science (80-.). 216, 1018-1020 (1982).
Athenstaedt, H. Permanent longitudinal electric polarization and pyroelectric behaviour of collagenous structures and hervous tissue in man and other vertebrates. Nature 228, 830-834 (1970).
Reinish, G. B. & Nowick, A. S. Piezoelectric properties of bone as functions of moisture content. Nature 253, 626-627 (1975).
Zilberstein, R. M. Piezoelectric activity in invertebrate exoskeletons. Nature 235, 174-175 (1972).
Petroff, C. A. et al. Intrinsically Polar Piezoelectric Self-Assembled Oligopeptide Monolayers. Adv. Mater. 33, 2007486 (2021).
Liu, Y., Zhang, Y., Chow, M. J., Chen, Q. N. & Li, J. Biological ferroelectricity uncovered in aortic walls by piezoresponse force microscopy. Phys. Rev. Lett. 108, 1-5 (2012).
Liu, Y. et al. Ferroelectric switching of elastin. Proc. Natl. Acad. Sci. U. S. A. 111, (2014).

* cited by examiner

*Primary Examiner* — C Melissa Koslow
(74) *Attorney, Agent, or Firm* — S&F/WEHRW (57) ABSTRACT

A piezoelectric bio-organic films resembling ceramic-based piezoelectric films, and also a fabrication method thereof. In particular, the bio-organic piezoelectric films are formed by compact nanocrystals resembling the inorganic ceramic structure, where nanocrystallization on biomaterials and in-situ electric field are applied to facilitate domain orientation alignment across the entire films. The present fabrication method provides flexibility to tune various parameters of the resulting bio-organic films according to the needs, and therefore is substantially applicable to a wide range of biomaterials to form piezoelectric bio-organic films comparable to those formed by conventional piezoceramics in terms of piezoelectricity, thermostability and durability.

17 Claims, 10 Drawing Sheets

PIEZOELECTRIC BIO-ORGANIC FILMS AND FABRICATION METHOD THEREOF

TECHNICAL FIELD

The present invention relates to piezoelectric bio-organic films resembling ceramic-based piezoelectric films, and also a fabrication method thereof. In particular, the piezoelectric bio-organic films are formed by compact nanocrystals resembling the inorganic ceramic structure, where nanocrystallization on biomaterials and in-situ electric field are applied to facilitate domain orientation alignment across the entire films.

BACKGROUND

Piezoelectricity is an intrinsic property of materials with a non-centrosymmetric structure that allows robust and precise conversion between electricity and mechanical energy. The extensive and ongoing research on advanced piezoelectric materials has benefited a broad range of applications in actuators, sensors, acoustics, nanogenerators, and scanning probe microscopes. Although people are endeavoring to develop synthetic piezoelectric materials, nature seems to have grasped the effect for millions of years. Piezoelectric biomaterials have superiority over other piezoelectric materials for biotechnology applications since they naturally exhibit biocompatibility, accessibility, and environmental sustainability. However, most research on piezoelectric biomaterials is theoretical, and challenges in aligning the domain orientation and the weak piezoelectricity remain a roadblock toward their practical applications.

Although various self-assembly methods have been developed to synthesize piezoelectric biomaterials, most techniques were relatively complex to scale up and challenging to achieve the strongest polar orientation in the out-of-plane direction. For more than half a century, piezoceramics, represented by PZT, have always been taking the dominant role thanks to their adjustable piezoelectricity, excellent stability, low cost, and easy preparation. They can be constructed with desired shapes and diverse sizes and evolved into piezoelectric metamaterials or flexible composites. There provides a white space for the present inventors to think of producing bio-organic piezoelectric materials like inorganic ceramics.

U.S. Pat. No. 9,761,789 disclosed methods and compositions for preparing silk-based piezoelectric materials and methods for increasing piezoelectricity in silk. The process for producing a piezoelectric material from silk includes the steps of providing a silk matrix, e.g., a silk film; heating at least a portion of the silk matrix at a temperature of no less than glass transition temperature of the silk matrix; and elongating the silk matrix. Furthermore, a process of increasing piezoelectricity in a silk matrix, e.g., at an ambient temperature comprises providing a silk matrix, contacting at least a portion of the provided silk matrix with an aqueous solvent, e.g., water, and elongating the silk matrix, e.g., the hydrated silk matrix, at an ambient temperature. The invented piezoelectric material formed by the process of their invention was applied to a sensor or a cardiac assistance device, e.g., a pacemaker.

US 2013/0052254 A1 disclosed system and method for a piezoelectric scaffold for tissue growth and repair. An electroactive structure and method for growing isolated differentiable cells comprising a three dimensional matrix of fibers formed of a biocompatible synthetic piezoelectric polymeric material was introduced, wherein the matrix of fibers is seeded with the isolated differentiable cells and forms a supporting scaffold for growing the isolated differentiable cells, and wherein the matrix of fibers stimulates differentiation of the isolated differentiable cells into a mature cell phenotype on the structure. The polymer scaffolds is demonstrated with the potential for promoting tissue growth, differentiation, and/or repair.

Lee et al. (2012) proposed scalable self-assembled thin films of phage virus and the nanogenerator based on phage. The phage exhibits piezoelectric constant of 7.8 pm/V. It was also demonstrated that the piezoelectric response can be tuned by by genetically engineering the major coat proteins of the phage. Finally, a phage-based piezoelectric generator was developed that produces up to 6 nA of current and 400 mV of potential and use it to operate a liquid-crystal display. However, the antiparallel in-plane polarization of virus-based nanogenerators greatly weakens their piezoelectricity and limits the output performance.

Nguyen et al. (2016) demonstrated the polarization alignment of peptides and the peptide-based nanogenerator. The polarization was controlled by an electric field applied during the peptide self-assembly process. Uniform polarization is obtained in two opposite directions with an effective piezoelectric constant $d_{33}$ reaching 17.9 pm/V. The peptide-based power generator was also demonstrated that can produce an open-circuit voltage of 1.4 V and a power density of 3.3 nW/cm$^2$.

Yang et al. (2021) provided a wafer-scale approach to creating piezoelectric biomaterial thin films based on g-glycine crystals. The thin film has a sandwich structure, where a crystalline glycine layer self-assembles and automatically aligns between two polyvinyl alcohol (PVA) thin films. The heterostructured glycine-PVA films exhibit piezoelectric coefficients of 5.3 pm/V or 157.5×10$^{-3}$ V m/N and nearly an order of magnitude enhancement of the mechanical flexibility compared with pure glycine crystals. Although γ-glycine-PVA films were demonstrated with uniform and decent piezoelectricity, they just exhibit part of the intrinsic strongest piezoelectricity since the polarization orientation [001] is not parallel to out-of-plane [101].

A solution to fabricate piezoelectric polycrystalline films resembling the inorganic ceramic structure is therefore in need to at least diminish or eliminate the disadvantages and problems described above.

SUMMARY OF THE INVENTION

The present disclosure proposes a strategy to fabricate piezoelectric polycrystalline films solely based on biomaterials resembling the inorganic ceramic structure. During synthesis, the electric field is used not only to create the nanocrystals, but also to play the role of in-situ poling that facilitates the domain orientation alignment across the entire film. The bio-organic films as-fabricated exhibit an outstanding piezoelectric property, as well as anomalously excellent thermodynamic stability resulting from the nanoconfinement effect. Furthermore, the proposed strategy is extricated from the interface dependency of traditional self-assembly methods due to the homogeneous nucleation of nanocrystals. It is scalable to contrive films with variable sizes, programmable structures, and diverse materials forms, which may make biomaterials have broader application prospects like piezoelectric ceramics Accordingly, a first aspect of the prevent invention provides piezoelectric bio-organic films formed by compact nanocrystals of biomaterials.

In an exemplary embodiment, the compact nanocrystals in the resulting bio-organic films are in an average grain size from approximately 100 nm to 800 nm. The resulting bio-organic films may have piezoelectric strain constant, $d_{33}$, from 5 to 15 pm/V, piezoelectric voltage constant, $g_{33}$, from $150 \times 10^{-3}$ to $250 \times 10^{-3}$ V m/N, and a relative permittivity, F, of less than 10 (<10).

In certain embodiments, the $d_{33}$ of the resulting bio-organic films is equal to or more than 11 pm/V.

In certain embodiments, the $g_{33}$ of the bio-organic films is equal to or more than $250 \times 10^{-3}$ V m/N.

In certain embodiments, the relative permittivity of the bio-organic films is equal to or lower than 8 (≤8).

In certain embodiments, the resulting bio-organic films have anomalously excellent thermodynamic stability, exhibiting no phase transition until melting.

In certain embodiments, the biomaterials constituting the compact nanocrystals include one or more of glycine, L-alanine, DL-alanine, DL-threonine, DL-leucine, and L-Phenylalanine-L Phenylalanine.

In an exemplary embodiment, the biomaterials are selected from glycine.

In certain embodiments, the shape, surface area, thickness, crystallinity, piezoelectricity and relative permittivity of the bio-organic films are tunable according to the application thereof.

In certain embodiments, the thickness of the resulting bio-organic films is from 2 μm and 30 μm.

In certain embodiments, the resulting bio-organic films formed by compact nanocrystals of glycine are characterised by X-ray powder diffraction with major peaks at about 23.6 and 28.6 (doublet) degrees two-theta In certain embodiments, the bio-organic films can be deposited on various substrates to form structural programmable piezoelectric thin films.

In certain embodiments, the various substrates include, but not limited to, organic or inorganic, or organic-inorganic hybrid substrates. More specifically, the various substrates include silicon, mica, glass, plastic, and steel.

In certain embodiments, the various substrates are also deposited with conductive materials to form conductive electrode.

In certain embodiments, the conductive materials forming the conductive electrode on the various substrate include, but not limited to, gold (Au), silver (Ag), magnesium (Mg), molybdenum (Mo) and copper (Cu).

In certain embodiments, the conductive materials are deposited on the substrate before deposition of the bio-organic films.

In a second aspect, the present invention provides a method of fabricating the present bio-organic films. The method includes:
  providing a homogenous solution of biomaterials;
  applying an electric field to the homogenous solution for overcoming surface tension of an aqueous portion of the homogenous solution to produce numerous nanodroplets containing the biomaterials;
  performing homogenous nucleation on the nanodroplets until nanocrystals are formed.

In certain embodiments, the providing of the homogenous solution of the biomaterials includes dissolving the biomaterials into a solution followed by mixing until a homogenous solution is formed.

In certain embodiments, the mixing of the biomaterials and the solution is performed at about 60° C. for about 3 hrs.

In certain embodiments, the biomaterials include one or more of glycine, L-alanine, DL-alanine, DL-threonine, DL-leucine, and L-Phenylalanine-L Phenylalanine.

In certain embodiments, the biomaterials are selected from glycine.

In certain embodiments, the applying of the electric field to the homogenous solution is performed by an electrohydrodynamic jet platform.

In certain embodiments, the thickness of the resulting bio-organic films is tunable by varying injection time of the homogenous solution by the electrohydrodynamic jet.

In certain embodiments, the area of the resulting bio-organic films is tunable by varying moving range of the electrohydrodyanmic jet during the injection of the homogenous solution.

In certain embodiments, the nanocrystals are deposited on a substrate with a conductive electrode.

In certain embodiments, the structure and shape of the resulting bio-organic films is tunable by varying mobile route of the electrohydrodynamic jet and the structure of the substrate.

In certain embodiments, the electrohydrodynamic jet platform comprises a needle with a syringe, a syringe pump, a power supply and an X-Y movement platform.

In certain embodiments, the needle is an atomizing needle.

In certain embodiments, the atomizing needle is inserted in epoxy resin for fixation to the platform and electrical insulation.

In certain embodiments, the atomizing needle has an outer and inner diameters of 0.31 and 0.16 mm, respectively.

In certain embodiments, the homogenous solution is applied to the syringe of the electrohydrodynamic jet platform for atomization under an electric stimulation.

In certain embodiments, the needle of the syringe is connected to the power supply, and the power supply provides the electric field for generating a liquid jet.

In certain embodiments, the electric field provided for the needle of the syringe to generate the liquid jet is from 4 to 4.5 KV.

In certain embodiments, the homogenous solution is applied to an inlet of the syringe with an aid by the syringe pump via a rubber tube at a flow rate of about 0.5 to 1.2 μL/min.

In certain embodiments, the X-Y movement platform is fully automated or can be controlled manually.

In certain embodiments, the substrate includes silicon, mica, glass, plastic, and steel, or any combination thereof.

In certain embodiments, the plastic substrate includes one or more of polyethylene terephthalate (PET), polyethylene naphthalate (PEN), polylactic acid (PLA), and poly(methyl methacrylate) (PMMA).

In certain embodiments, the conductive electrode is made of conductive materials including Au, Ag, Mg, Mo and Cu, or any combination thereof.

In certain embodiments, a polished metal plate acting as a ground electrode is fixed on a computer-controlled X-Y movement platform and grounded reliably.

In certain embodiments, a polished aluminum plate with a dimension of 100 mm×100 mm×5 mm is used as a ground electrode, and disposed at a distance from the needle tip of the syringe in a range of 4 to 6 mm.

In certain embodiments, the bio-organic films are further coated with a polymer including polyvinylidene fluoride (PVDF), polydimethylsiloxane (PDMS) and PLA.

In certain embodiments, the resulting bio-organic films are obtained in free-standing form by peeling off from the substrate after coating with the polymer.

A third aspect of the present invention provides a piezoelectric device incorporating the bio-organic films as a piezoelectric layer or prepared according to the fabrication method described in certain embodiments of the present invention.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF DRAWINGS

The appended drawings, where like reference numerals refer to identical or functionally similar elements, contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which.

Skilled artisans will appreciate that elements in the figures are illustrated for simplicity and clarity and have not necessarily been depicted to scale.

DETAILED DESCRIPTION OF THE INVENTION

It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Fabrication of Piezoelectric Bio-Organic Thin Films on Conductive Substrate

Figure 1:
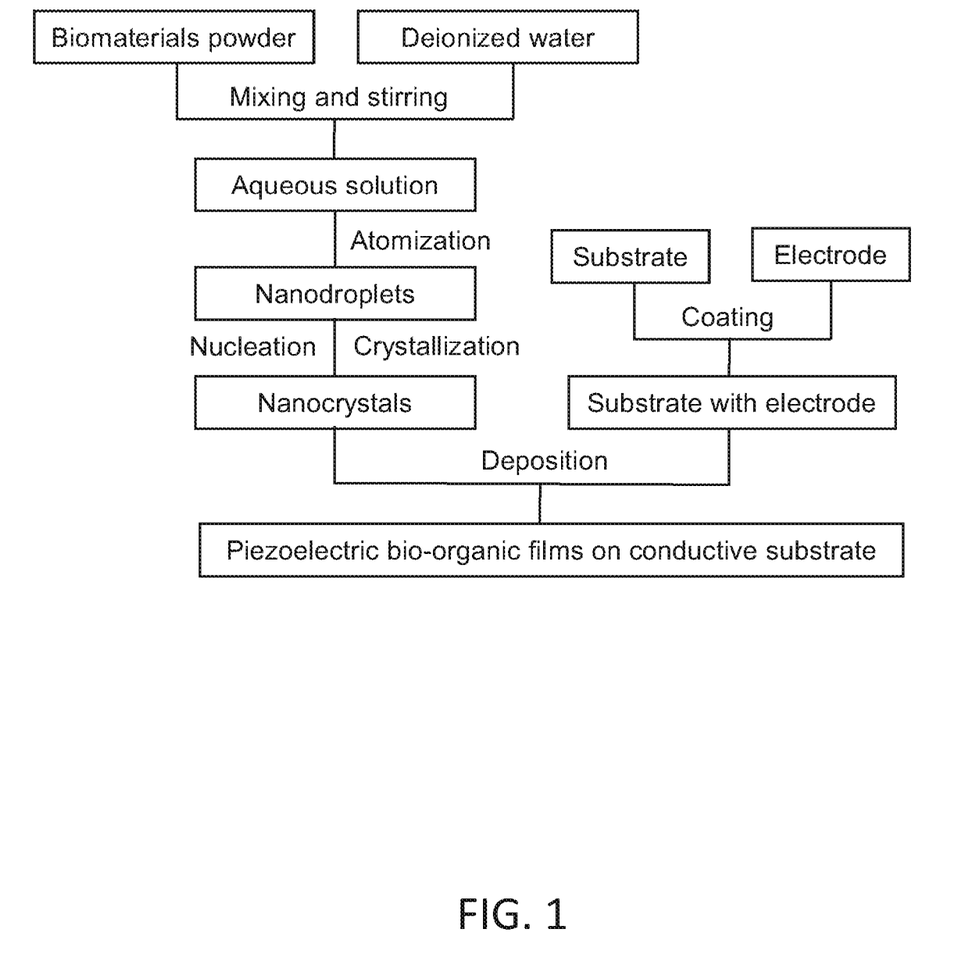
FIG. 1 shows a flowchart of a fabrication method of the bio-organic films according to certain embodiments of the present invention.

Turning to FIG. 1, the fabrication of the present bio-organic films from biomaterials using in situ electric filed and nanocrystallization process to form the bio-organic films on a substrate is provided as a flowchart, including preparing a homogenous glycine solution, atomization of the homogenous glycine solution into nanodroplets, nucleation and nanocrystallization of nanodroplets to form glycine nanocrystals, coating a conductive solution on the substrate as an electrode, and depositing the glycine nanocrystals.

Initially, a 10% w/v of glycine powder is dissolved in deionized water, and mixed by stirring under magnetic rotator at 60° C. for 3 hours until a homogenous solution is obtained. The solution is covered in order to avoid the formation of a glassy solid layer at the air-solution interface during the preparation process. The as-prepared mixture solution will then be directly used for film growth.

The obtained glycine aqueous solution is then transferred to an electrohydrodynamic jet platform for subsequent film growth. An image of the electrohydrodynamic jet platform is provided in FIG. 2. In certain embodiments, the electrohydrodynamic jet platform consists of a needle (e.g., a stainless steel needle), a syringe pump, a power supply, and a X-Y movement platform controlled by computer. The obtained glycine aqueous solution is pumped by the syringe pump into the syringe needle of the electrohydrodynamic jet platform. An electric field is applied to the needle in order to overcome the surface tension of the aqueous solution to produce numerous nanodroplets, leading to the formation of nanocrystals. The nanocrystals are then formed by homogeneous nucleation, which makes it easier to control the crystallization process by the electric field. The in-situ electric field in the crystal growth process facilitates domain orientation alignment of nanocrystals across the entire film.

At the same time, the substrate on which the bio-organic films will form is first coated with a conductive electrode, e.g., Au electrode. The electrode can be coated on the substrate by sputtering or any other coating method commonly used by skilled artisan in the same field.

Finally, piezoelectric bio-organic films are formed on the conductive electrode. To facilitate removal from the conductive electrode to obtain a free-standing piezoelectric bio-organic films, the piezoelectric bio-organic films can be coated with a polymer which allows direct peeling off the resulting bio-organic films from the conductive electrode.

Figure 2:
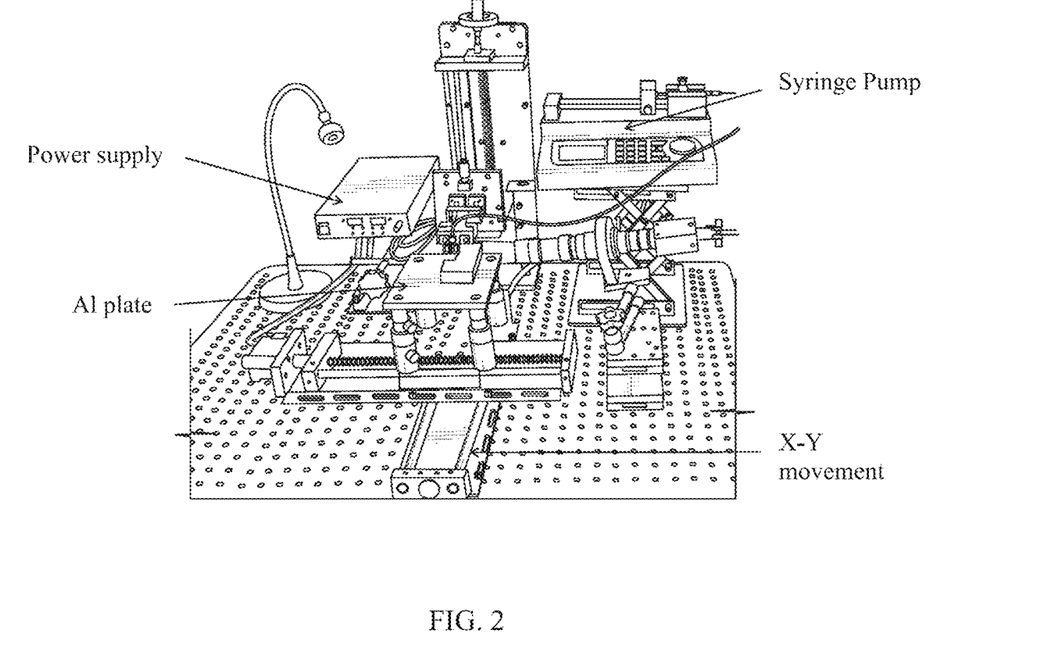
FIG. 2 shows an image of electrohydrodynamic jet platform used in fabrication of the bio-organic films according to certain embodiments of the present invention.

Turning to FIG. 2, a customized electrohydrodynamic jet platform is provided for preparing glycine nanocrystals and deposition on the substrate with a conductive electrode according to certain embodiments of the present invention. In the setup shown in FIG. 2, an atomizing needle, with an outer/inner diameter of 0.31/0.16 mm, is inserted in epoxy resin for fixation and electrical insulation. The outlet of the needle is connected via metal wire to a high voltage power supply which is used to provide the electric field force for a liquid jet formation (4-4.5 KV). The inlet of the needle is connected to a microinjection pump via silicone rubber tube through which the solution is pumped (0.5-1.2 μL/min). A polished aluminum plate with a dimension of 100 mm×100 mm×5 mm, acting as a ground electrode, is fixed on the computer-controlled X-Y movement platform and grounded reliably. The distance between the polished aluminum plate and needle tip is about 4-6 mm.

Figure 3:
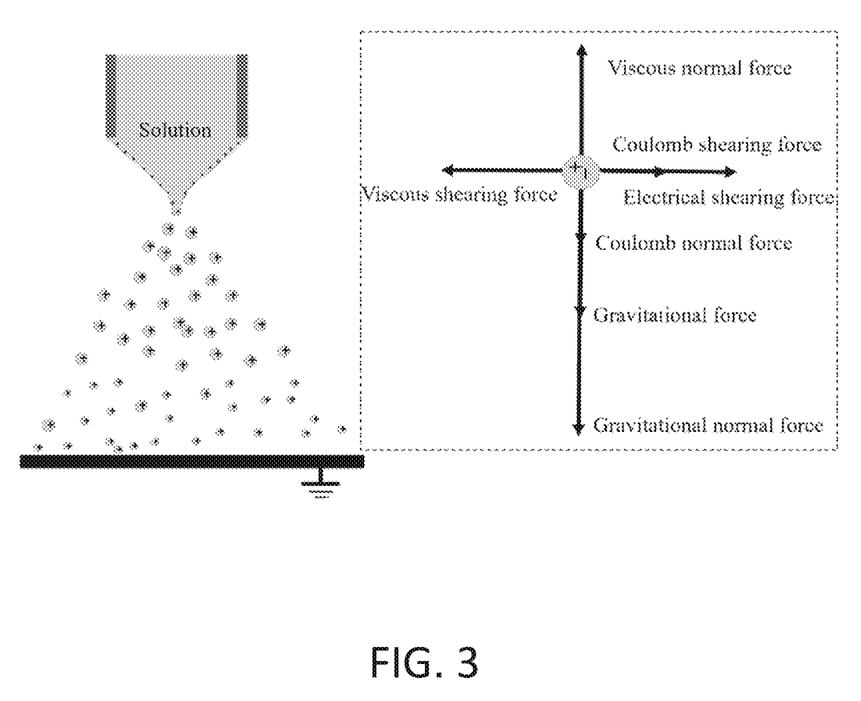
FIG. 3 schematically depicts an atomization process used in fabrication of the bio-organic films according to certain embodiments of the present invention.

FIG. 3 depicts the atomization process used in the present invention, which the electric field applied to the needle overcomes the surface tension of the aqueous solution to produce numerous nanodroplets, leading to the nucleation and crystallization of β-glycine nanocrystals. The nanodroplets are affected by the force of viscous normal force, coulomb shearing force, electrical shearing force, coulomb normal force, gravitational force gravitational normal force and viscous shearing force.

Figure 4:
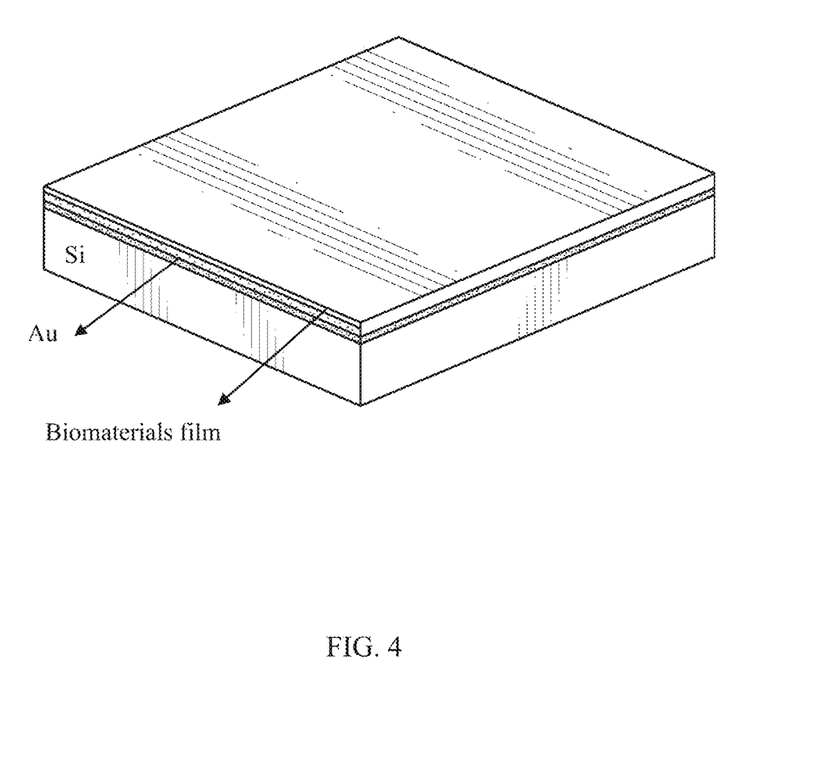
FIG. 4 schematically depicts a piezoelectric bio-organic film formed on the conductive substrate according to certain embodiments of the present invention.

FIG. 4 illustrates a basic structure of a piezoelectric bio-organic thin film formed on the conductive substrate including an n-type single crystal silicon, sputtered gold electrode and deposited glycine polycrystalline film. The electrode coating method includes sputtering using metal target and spin-coating using conductive paste. The glycine polycrystalline film is deposited by the customized electrohydrodynamic jet platform as shown in FIG. 2.

Characterization of Bio-Organic Films

Figure 5A:
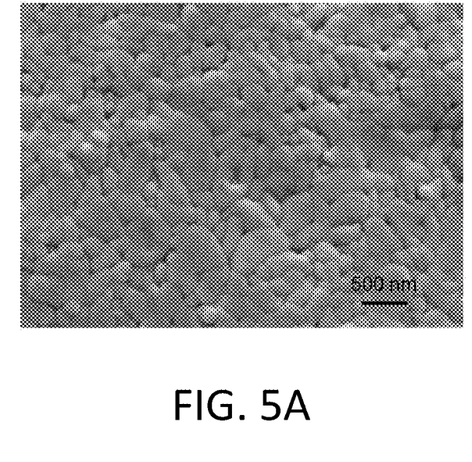
FIG. 5A shows a scanning electron microscope (SEM) image of the surface topography of β-glycine nanocrystal film.

Turning to FIG. 5A, the scanning electron microscope (SEM) image of the surface topography of β-glycine nanocrystal film shows that the architecture of glycine nanocrystal film resembles the structure of inorganic ceramics. The microstructures of the surfaces of SIS are observed with scanning electron microscopy (SEM; FEI Quanta 450). Before the SEM measurements, all the samples are deposited with the silver electrode by magnetron sputtering (Q150TS). In FIG. 5A, an average grain size of the nanocrystals is measured to be with a range of 100 to 800 nm.

Figure 5B:
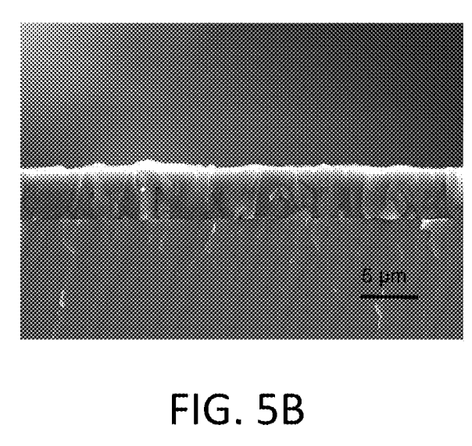
FIG. 5B shows an SEM image of the cross-section of β-glycine nanocrystal film on the silicon substrate; thickness of the film: ~4 µm.

FIG. 5B shows an SEM image of the cross-section of β-glycine nanocrystal film deposited on a silicon substrate. The thickness of the film is about 4 μm. From the SEM image, the deposited bio-organic film exhibit a uniform and compact distribution of nanocrystals, which may improve the piezoelectric performance.

Figure 6A:
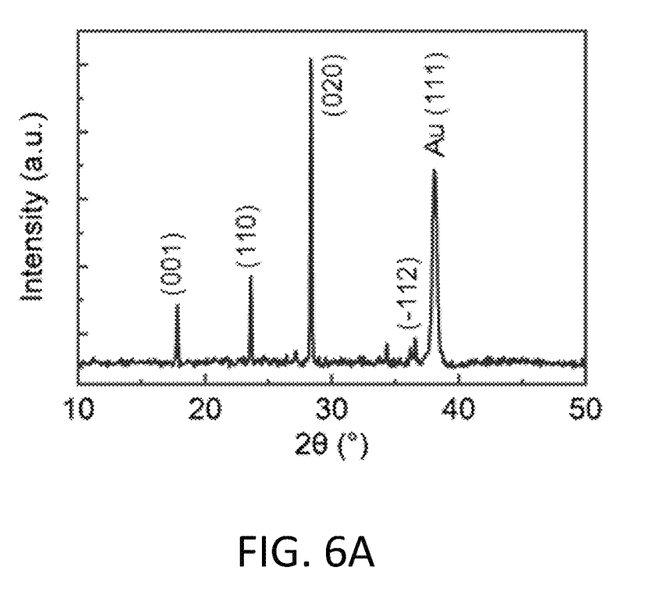
FIG. 6A shows X-ray diffraction (XRD) spectrum obtained from the as-fabricated films of β-phase glycine according to certain embodiments of the present invention.
Figure 6B:
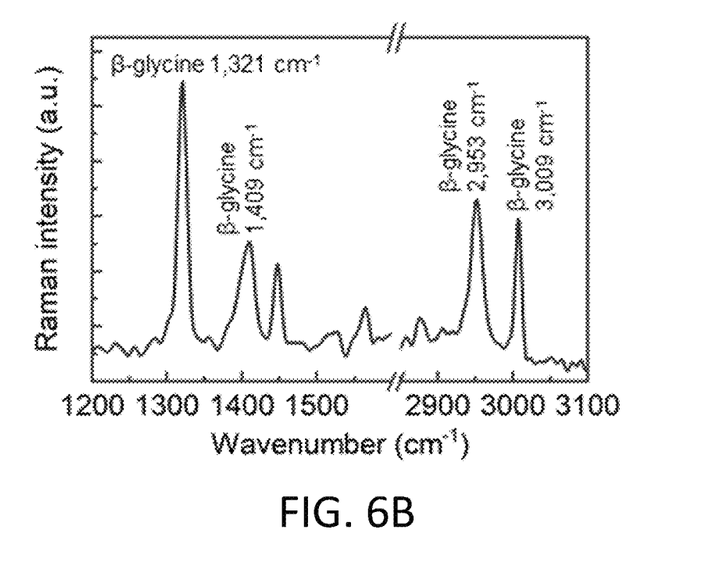
FIG. 6B shows Raman spectrum obtained from the as-fabricated films of β-phase glycine according to certain embodiments of the present invention.

Turning to FIG. 6A, an X-ray diffraction (XRD) spectrum obtained from as-fabricated films exhibit major characteristic peaks (at about 23.6° and 28.6° two-theta) of β-phase glycine, and no diffraction peaks from other phases could be observed, confirming that the as-fabricated film is dominated by the piezoelectric β-glycine crystals. The X-ray diffraction (XRD) pattern is obtained by a wide-angle X-ray diffractometer in the range of 10-50° (Ultima VI). The crystal structure of the j-phase glycine is further evidenced by Raman spectroscopy. FIG. 6B shows that four distinct Raman shifts of j-phase glycine crystals are observed at wavenumber of 1321, 1409, 2953 and 3009 $cm^{-1}$, respectively.

Figure 7A:
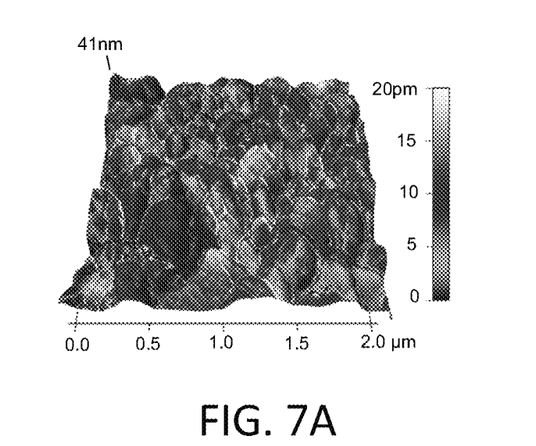
FIG. 7A shows piezoresponse force microscopy (PFM) mapping of out-of-plane (OOP) amplitude of the β-glycine film fabricated according to certain embodiments which is overlaid on 3D topography.

Turning to FIG. 7A, piezoresponse force microscopy (PFM) is used in this study to quantify biological piezoelectricity in glycine film, by applying an AC voltage through the conductive atomic force microscopy (AFM) tip to excite the piezoelectric vibration of the sample. In FIG. 7A, the PFM mapping of out-of-plane (OOP) amplitude of the glycine film overlays on 3D topography in a 2×2 $\mu m^2$ area, exhibiting superb and uniform piezoelectric response of compact nanocrystals. PFM measurement in this study is conducted with an Asylum MFP 3D system. The used probe is an Asylum Research Arrow EFM with Pt/Ir coating on both cantilever and tip. The nominal resonance frequency of the probe was 75 kHz, and the tip radius is 33±10 nm according to the manufacturer. The inverse optical lever sensitivity and spring constant are calibrated before all measurements using Asylum's software GetReal.

Figure 7B:
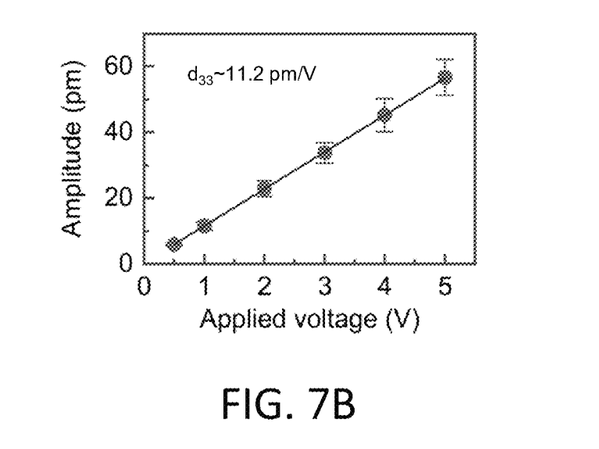
FIG. 7B shows a correlation between the OOP amplitude and applied AC voltage on the β-glycine film.

Turning to FIG. 7B, to further quantify the piezoelectric strength of the glycine film, the PFM amplitudes averaged over the mapping under applied AC voltage of 0.5, 1, 2, 3, 4, 5 V, respectively, are measured in Dual AC Resonance Tracking (DART) mode. DART mode is used to reduce noise and topography crosstalk when determining the phase responses of the array. The probe is excited at 1 V amplitude and contact resonance frequency is typically around 300 kHz. To determine the effective piezoelectric coefficient $d_{33}$, an area of 300×300 $nm^2$ is scanned under AC voltages between 0.5 and 5 V. The average vibration amplitudes in each scanned area are recorded to calculate the effective $d_{33}$. As shown in FIG. 7B, the OOP amplitude yielded increases linearly as a function of the applied AC voltage, and the slope yields the effective shear piezoelectric coefficient around 11.2 μm/V. In all PFM scans, the probe is typically pressed on the sample surface with a force of about 100 nN.

Figure 8A:
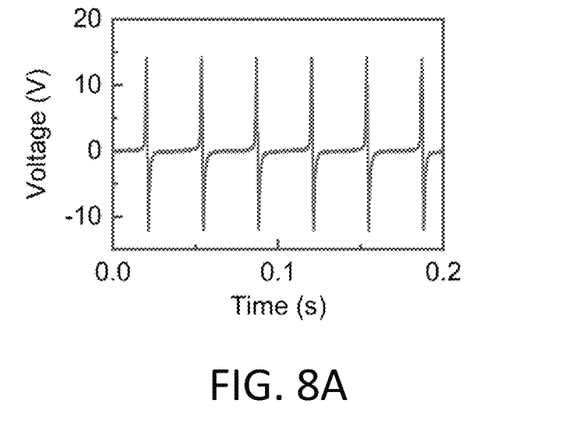
FIG. 8A shows the piezoelectric voltage response of the β-glycine films deposited on a PMMA substrate coated with Au electrode fabricated according to certain embodiments of the present invention in a tapping test; film thickness: ~5 µm.
Figure 8B:
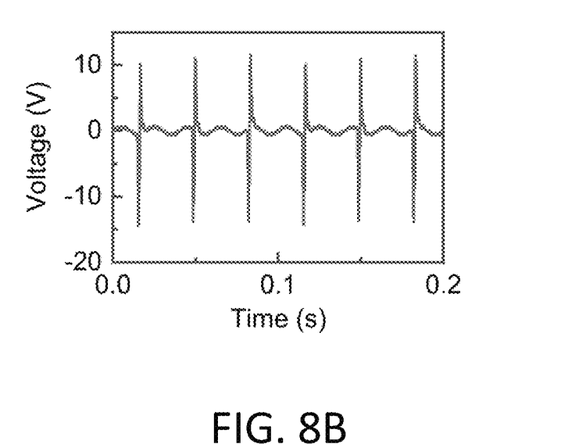
FIG. 8B shows the results of a reversed connection tapping test with respect to that in FIG. 8A.

FIG. 8A shows the piezoelectric voltage response of glycine films deposited on the PMMA substrate coated with Au electrode. The film thickness of the sample in this study is about 5 m, and a PMMA plate coated with Au is served as the top electrode. In the tapping mode, when a compressive force is loaded under a tapping process with a frequency of 30 Hz, high open-circuit voltage output occurs. Under 10 N applied tapping force, the output voltage reaches 15 V, which is superior to any piezoelectric bio-organic materials previously reported. FIG. 8B shows a reversed connection test of the tapping test as in FIG. 8A, and the results demonstrate that all outputs are reversed. The switching-connection test excludes the errors from the variation of contact resistance or parasitic capacitance and confirms that the detected electrical signal is truly from the piezoelectric glycine films. The piezoelectric output voltage is measured by a digital oscilloscope (Rohde & Schwarz RTE1024).

Figure 9A:
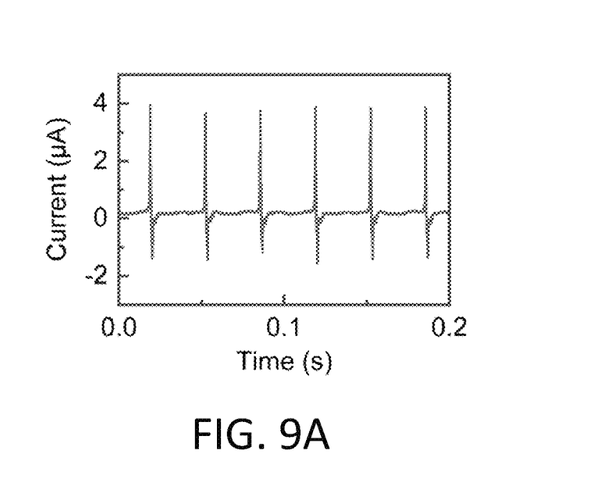
FIG. 9A shows the piezoelectric current response of the β-glycine films according to certain embodiments of the present invention with a thickness of approximately 5 µm in a tapping test.
Figure 9B:
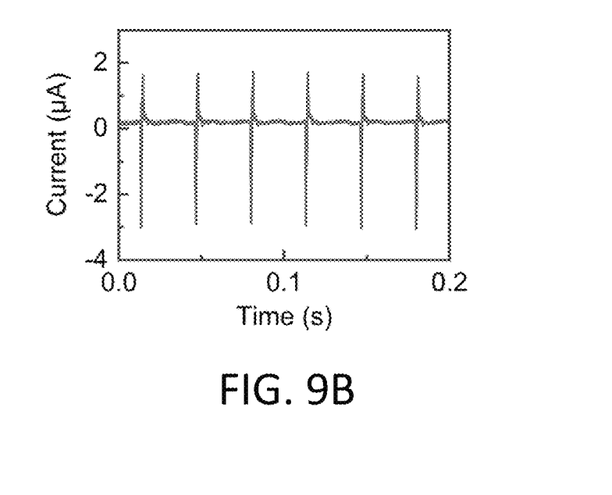
FIG. 9B shows the results of a reversed connection tapping test with respect to that in FIG. 9A.

Turning to FIG. 9A, the piezoelectric current response of as-fabricated glycine films with a thickness of approximately 5 μm is tested. The piezoelectric output current is measured by a low-noise current preamplifier (Stanford Research SR570). Under 10 N applied tapping force, the output voltage reaches 4 μA, which is an order of magnitude larger than any piezoelectric bio-organic materials previously reported. Similar to the reverse connection setup used in FIG. 8B, the reversed connection test results in FIG. 9B show that all outputs are reversed with respect to those in FIG. 9A.

Figure 10A:
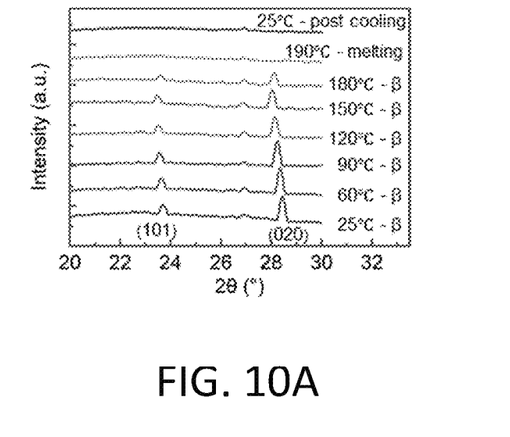
FIG. 10A shows the in situ XRD test results of the β-glycine films fabricated according to certain embodiments of the present invention.
Figure 10B:
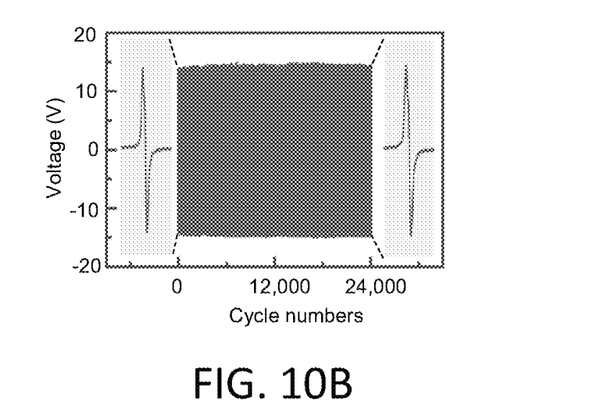
FIG. 10B shows the piezoelectric voltage response of β-glycine films fabricated according to certain embodiments of the present invention with a thickness of approximately 5 µm upon 24,000 tapping cycles.

Turning to FIG. 10A, besides excellent piezoelectric responses, the bio-organic β-glycine films as-fabricated also exhibit excellent thermostability and superb durability in longtime deformation. The in situ XRD test result in FIG. 10A shows that the bio-organic β-glycine films exhibits anomalous stability without phase transition until melting (at a melting temperature of about 180° C.) resulting from nanoconfinement effects. FIG. 10B shows durability of β-glycine films by measuring the piezoelectric voltage response in longtime deformation cycles. Upon 24,000 tapping cycles, the output voltage of the piezoelectric β-glycine films is kept unchanged. In this study, the bio-organic β-glycine films have a uniform thickness of approximately 5 μm.

In summary, the present bio-organic films and the related fabrication method have the following characteristics and advantages:

1) The bio-organic films exhibit an outstanding piezoelectric property, as well as anomalously excellent thermodynamic stability resulting from the nanoconfinement effect;
2) The fabrication method of bio-organic films is extricated from the interface dependency of traditional self-assembly methods due to the homogeneous nucleation of β-glycine nanocrystals;
3) The flexibility of the present invention to produce films with variable sizes, programmable structures, and diverse materials forms increases the potential of biomaterials as materials of piezoelectric thin film in a wide variety of products like piezoelectric ceramics.

Although the invention has been described in terms of certain embodiments, other embodiments apparent to those of ordinary skill in the art are also within the scope of this invention. Accordingly, the scope of the invention is intended to be defined only by the claims which follow.

INDUSTRIAL APPLICABILITY

Due to superb piezoelectricity, excellent thermostability, biocompatibility, accessibility, and environmental sustainability, the present invention can be used as high-performance implantable sensors, actuators, energy harvesters.

The present fabrication method for the piezoelectric bio-organic films based on the electric field-driven nanoconfinement technique can also be applied to other biomaterials, achieving excellent piezoelectric output performance.

Various tunable parameters of the bio-organic films provide a flexibility of the present invention to fit into different applications such as flexible and wearable electronics with irregular shape or size.

REFERENCES

The following is a citation list of non-patent literatures described herein or relevant to the present invention:
1. Yang, Z., Zhou, S., Zu, J. & Inman, D. High-Performance Piezoelectric Energy Harvesters and Their Applications. *Joule* 2, 642-697 (2018).
2. Hong, Y. et al. Hierarchically Interconnected Piezoceramic Textile with a Balanced Performance in Piezoelectricity, Flexibility, Toughness, and Air Permeability. *Adv. Funct. Mater.* 2104737 (2021) doi:10.1002/ADFM.202104737.
3. Liu, S. et al. A flexible and lead-free BCZT thin film nanogenerator for biocompatible energy harvesting. *Mater. Chem. Front.* 5, 4682-4689 (2021).
4. Zhang, Q. M., Bharti, V. & Zhao, X. Giant electrostriction and relaxor ferroelectric behavior in electron-irradiated poly(vinylidene fluoride-trifluoroethylene) copolymer. *Science* (80-.). 280, 2101-2104 (1998).
5. Guerin, S. et al. Control of piezoelectricity in amino acids by supramolecular packing. *Nat. Mater.* 17, 180-186 (2018).
6. Yang, F. et al. Wafer-scale heterostructured piezoelectric bio-organic thin films. *Science* (80-.). 373, 337-342 (2021).
7. Kim, D. et al. Biomolecular Piezoelectric Materials: From Amino Acids to Living Tissues. *Adv. Mater.* 32, 1-16 (2020).
8. Nguyen, V., Zhu, R., Jenkins, K. & Yang, R. Self-assembly of diphenylalanine peptide with controlled polarization for power generation. *Nat. Commun.* 7, 1-6 (2016).
9. Bera, S. et al. Molecular engineering of piezoelectricity in collagen-mimicking peptide assemblies. *Nat. Commun.* 12, (2021).
10. Lee, B. Y. et al. Virus-based piezoelectric energy generation. *Nat. Nanotechnol.* 7, 351-356 (2012).
11. Wang, J. et al. Piezoelectric Nanocellulose Thin Film with Large-Scale Vertical Crystal Alignment. *ACS Appl. Mater. Interfaces* 12, 26399-26404 (2020).
12. Shamos, M. H., Lavine, L. S. & Shamos, M. I. Piezoelectric effect in bone. *Nature* 197, 81-81 (1963).
13. Athenstaedt, H., Claussen, H. & Schaper, D. Epidermis of human skin: Pyroelectric and piezoelectric sensor layer. *Science* (80-.). 216, 1018-1020 (1982).
14. Athenstaedt, H. Permanent longitudinal electric polarization and pyroelectric behaviour of collagenous structures and nervous tissue in man and other vertebrates. *Nature* 228, 830-834 (1970).
15. Reinish, G. B. & Nowick, A. S. Piezoelectric properties of bone as functions of moisture content. *Nature* 253, 626-627 (1975).
16. Zilberstein, R. M. Piezoelectric activity in invertebrate exoskeletons. *Nature* 235, 174-175 (1972).
17. Petroff, C. A. et al. Intrinsically Polar Piezoelectric Self-Assembled Oligopeptide Monolayers. *Adv. Mater.* 33, 2007486 (2021).
18. Liu, Y., Zhang, Y., Chow, M. J., Chen, Q. N. & Li, J. Biological ferroelectricity uncovered in aortic walls by piezoresponse force microscopy. *Phys. Rev. Lett.* 108, 1-5 (2012).
19. Liu, Y. et al. Ferroelectric switching of elastin. *Proc. Natl. Acad. Sci. U.S.A* 111, (2014).

What is claimed is:

1. A piezoelectric bio-organic film comprising compact nanocrystals of one or more biomaterials formed by homogenous nucleation and in-situ electric field, the nanocrystals having an average grain size between 100 and 800 nm, and the piezoelectric bio-organic film having a piezoelectric strain constant from 5 to 15 pm/V, piezoelectric voltage constant of at least $150 \times 10^{-3}$ V m/N, and a relative permittivity of less than 10, wherein the one or more biomaterials constituting the compact nanocrystals include one or more materials of glycine, L-alanine, DL-alanine, DL-threonine, DL-leucine, or L-Phenylalanine-L Phenylalanine.

2. The piezoelectric bio-organic film of claim 1, wherein the one or more biomaterials are glycine.

3. The piezoelectric bio-organic film of claim 2, wherein the compact nanocrystals of glycine are characterised by X-ray powder diffraction with major peaks at about 23.6 and 28.6 degrees two-theta.

4. The piezoelectric bio-organic film of claim 1, wherein the compact nanocrystals of the one or more biomaterials are disposed on a conductive substrate, wherein the conductive substrate comprises a substrate material comprising silicon, mica, glass, plastic, steel, or any combination thereof and a conductive electrode comprising gold, silver, magnesium, molybdenum, copper, or any combination thereof.

5. The piezoelectric bio-organic film of claim 4, further comprising a polymer disposed on the piezoelectric bio-organic film.

6. The piezoelectric bio-organic film of claim 5, wherein the polymer comprises polyvinylidene fluoride, polydimethylsiloxane or polylactic acid.

7. A method for fabricating the piezoelectric bio-organic film of claim 1, the method comprising:
provid­ing a homogenous solution of biomaterials com­prising one or more of glycine, L-alanine, DL-alanine, DL-threonine, DL-leucine, or L-Phenylalanine-L Phe­nylalanine;
applying an electric field to the homogenous solution for overcoming surface tension of an aqueous portion of the homogenous solution to produce numerous nano­droplets containing the biomaterials;
performing homogenous nucleation on the nanodroplets until nanocrystals are formed; and
depositing the nanocrystals on a conductive substrate to form the piezoelectric bio-organic film.

8. The method of claim 7, wherein said providing the homogenous solution of the biomaterials comprises dissolv­ing the biomaterials into a solution followed by mixing under an elevated temperature until a homogenous solution is formed.

9. The method of claim 7, wherein said applying the electric field to the homogenous solution is through an electrohydrodynamic jet platform.

10. The method of claim 9, wherein the electrohydrody­namic jet platform comprises a needle with a syringe, a syringe pump, a power supply and an X-Y movement platform.

11. The method of claim 10, wherein the homogenous solution is introduced to the syringe of the electrohydrody­namic jet platform for subsequent atomization under an electric stimulation.

12. The method of claim 11, wherein the needle of the syringe is connected to the power supply, and the power supply provides an electric field to the needle of the syringe for generating a liquid jet.

13. The method of claim 10, wherein the X-Y movement platform is fully automated.

14. The method of claim 13, wherein a ground electrode is fixed on the fully automated X-Y movement platform and disposed at a distance from the needle tip of the syringe.

15. The method of claim 7, wherein the conductive substrate comprises a substrate material selected from sili­con, mica, glass, plastic, steel, or any combination thereof, and a conductive material for forming a conductive elec­trode on said substrate selected from gold, silver, magne­sium, molybdenum, copper, or any combination thereof, and wherein the conductive electrode is polished.

16. The method of claim 7, further comprising coating the piezoelectric bio-organic film with a polymer comprising polyvinylidene fluoride, polydimethylsiloxane, or polylactic acid.

17. A piezoelectric device comprising the bio-organic film according to claim 1.

* * * * *